United States Patent [19]

Okamoto

[11] Patent Number: 5,498,563
[45] Date of Patent: Mar. 12, 1996

[54] METHOD OF MANUFACTURING A STATIC RANDOM ACCESS MEMORY DEVICE INCLUDING A COUPLING CAPACITOR BETWEEN A PAIR OF STORAGE NODES

[75] Inventor: Yutaka Okamoto, Tokyo, Japan

[73] Assignee: Sony Corporation, Tokyo, Japan

[21] Appl. No.: 345,335

[22] Filed: Nov. 21, 1994

Related U.S. Application Data

[63] Continuation of Ser. No. 992,025, Dec. 17, 1992, abandoned.

[30] Foreign Application Priority Data

Dec. 17, 1991 [JP] Japan .................... 3-333665

[51] Int. Cl.⁶ .................... H01L 21/70; H01L 27/00
[52] U.S. Cl. .................... 437/52; 437/47; 437/919; 437/60
[58] Field of Search .................... 437/52, 919, 47, 437/918; 148/DIG. 16

[56] References Cited

U.S. PATENT DOCUMENTS 4,780,751  10/1988  Nishimoto .................... 257/79
4,805,147  2/1989   Yamanaka et al. .................... 251/904
4,965,214  10/1990  Choi et al. .................... 437/60
4,984,200  1/1991   Saitoo et al. .................... 437/52
5,145,799  9/1992   Rodder .................... 437/47

Primary Examiner—George Fourson
Assistant Examiner—H. Jey Tsai
Attorney, Agent, or Firm—Hill, Steadman & Simpson

[57] ABSTRACT

A static random access memory device a static memory cell comprising flip-flop composed of a pair of driver transistor having respective storage nodes, and a pair of high-resistance loads disposed on and connected to the storage nodes, respectively, a pair of access transistors connected to the storage nodes, and a capacitive element connected through a dielectric film between the storage nodes for preventing a software error due to exposure to α rays, for example. The capacitive element comprises a capacitor plate electrode providing a pair of capacitors connected in series between the storage nodes.

4 Claims, 5 Drawing Sheets

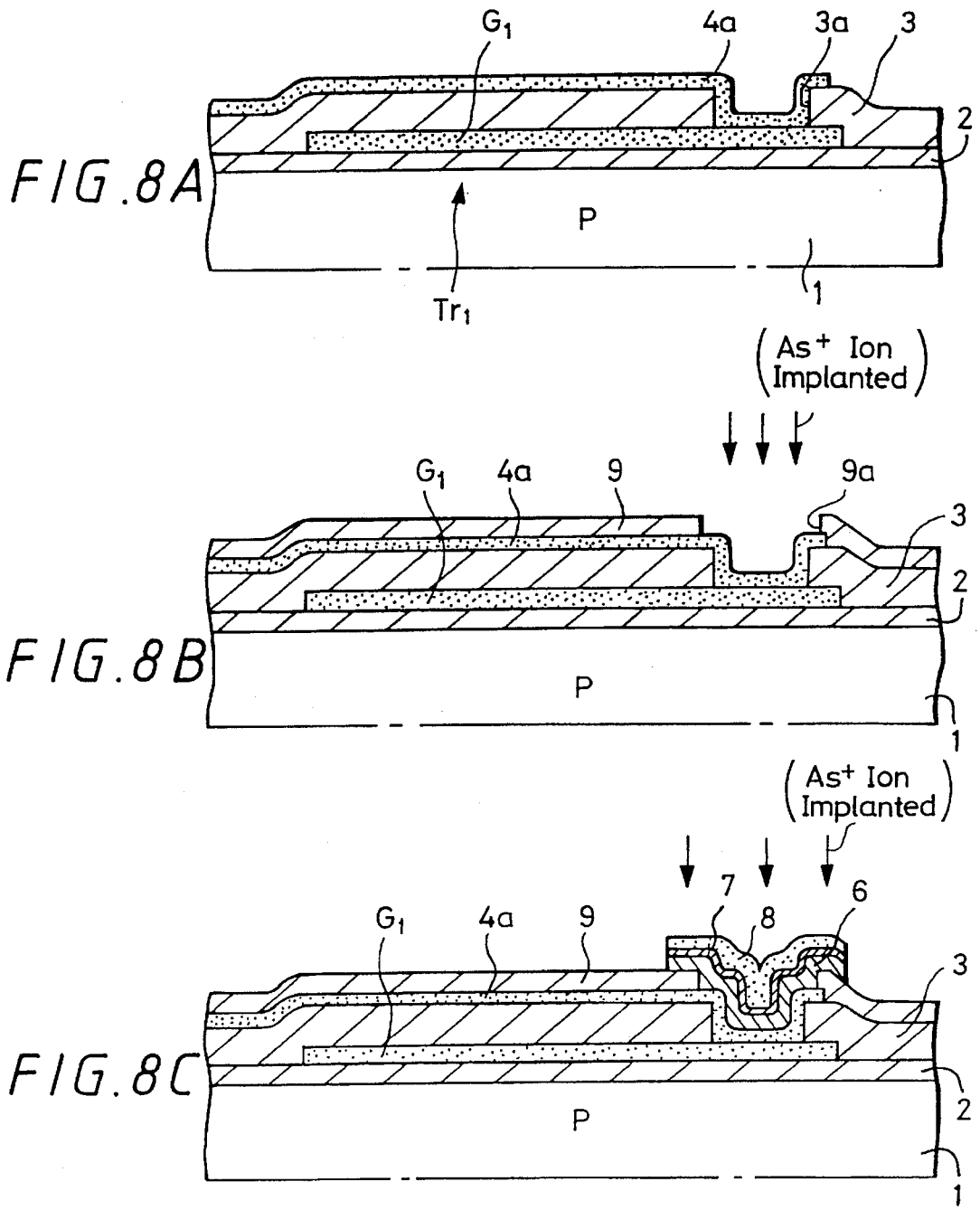

METHOD OF MANUFACTURING A STATIC RANDOM ACCESS MEMORY DEVICE INCLUDING A COUPLING CAPACITOR BETWEEN A PAIR OF STORAGE NODES

This is a continuation, of application Ser. No. 07/992,025 filed Dec. 17, 1992 now abandoned.

BACKGROUND OF THE INVENTION

1. Field of the Invention

The present invention relates to a semiconductor memory device, such as a static random access memory device, which is resistant to a software error that would otherwise be caused by exposure to α rays, for example, and a method of manufacturing such a semiconductor memory device.

2. Description of the Prior Art

As shown in FIG. 1 of the accompanying drawings, one conventional semiconductor memory device, such as a static random access memory (SRAM) device, has a memory cell composed of a flip-flop FF comprising a pair of driver transistors $Tr_1$, $Tr_2$ such as N-channel MOS transistors and a pair of high-resistance loads $R_1$, $R_2$ connected respectively to storage nodes $N_1$, $N_2$ of the driver transistors $Tr_1$, $Tr_2$, and a pair of access transistors $Q_1$, $Q_2$ such as N-channel MOS transistors. To the memory cell, there are connected a word line WL and bit lines $\overline{BL}$.

The physical structure of the conventional SRAM shown in FIG. 1 is shown in FIG. 2 of the accompanying drawings. The driver transistor $Tr_1$ has a gate electrode $G_1$, and the access transistor $Q_2$ has a gate electrode 21 which serves as part of the word line WL. These gate electrodes $G_1$, 21 are formed by a first layer of polycrystalline silicon. A layer 23 of polycrystalline silicon which serves as the high-resistance load $R_2$ is disposed over the gate electrode $G_1$ with an interlayer insulating film 22 interposed therebetween.

The polycrystalline silicon layer 23 and the gate electrode $G_1$ are connected to each other on a drain region 24 of the access transistor $Q_2$, the junction between the polycrystalline silicon layer 23 and the gate electrode $G_1$ serving as the storage node $N_1$ shown in FIG. 1. The access transistor $Q_2$ has a source region 25 to which the bit lines $\overline{BL}$ are connected. Aluminum interconnections 26 are disposed over the polycrystalline silicon layer 23 and a capacitor plate electrode 27, and connected to the polycrystalline silicon layer 23 and the capacitor plate electrode 27 at certain intervals.

To prevent the SRAM from suffering a software error due to exposure to α rays, for example, capacitors $C_1$, $C_2$ are connected between the storage nodes $N_1$, $N_2$ and ground as shown in FIG. 1. In FIG. 2, the capacitors $C_1$, $C_2$ are provided by the capacitor plate electrode 27 which is positioned over the junction between the polycrystalline silicon layer 23 and the gate electrode $G_1$ with a dielectric film interposed between. The capacitor plate electrode 27 is connected to a ground line (not shown) by an interconnection layer.

Since it is necessary to ground the capacitors $C_1$, $C_2$, the capacitor plate electrode 27 is required to be connected to the ground line by the interconnection layer.

The conventional SRAM therefore needs an extra region for the interconnection layer to connect the capacitor plate electrode 27 to the ground line. The fabrication process for the SRAM requires a step of defining an opening through which the interconnection layer can contact capacitor plate electrode 27 and the ground line. Therefore, the fabrication process is relatively complex, and the SRAM is relatively expensive to fabricate.

OBJECTS AND SUMMARY OF THE INVENTION

It is an object of the present invention to provide a semiconductor memory device which includes a capacitor plate electrode disposed over storage nodes that is not required to be grounded, and which has a large capacitance over the storage nodes in a small interconnection region.

Another object of the present invention is to provide a method of manufacturing a semiconductor memory device inexpensively through a simple process while producing a large capacitance over storage nodes relatively simply in a small interconnection region.

According to the present invention, there is provided a semiconductor memory device having a static memory cell comprising a flip-flop composed of a pair of driver transistors having respective storage nodes, and a pair of high-resistance loads disposed on and connected to the storage nodes, respectively, a pair of access transistors connected to the storage nodes, and a capacitive element connected through a dielectric film between the storage nodes. The capacitive element comprises a capacitor plate electrode providing a pair of capacitors connected in series between the storage nodes.

With the above arrangement of the semiconductor memory device, the storage nodes are connected to each other by the capacitor plate electrode through the dielectric film with the two capacitors connected in series between the storage nodes. The capacitance provided by the capacitors appears as a mirror capacitance due to the operation of the flip-flop, resulting in the same capacitance as the conventional semiconductor memory device, even without the capacitor plate electrode being grounded.

Stated otherwise, a large capacitance is provided over the storage nodes without the capacitor plate electrode being connected to a ground line. As the capacitor plate electrode is not grounded, no extra interconnection region is required, and it is not necessary to form an interconnection layer which would otherwise be needed to ground the capacitor plate electrode to a ground line, and to define an opening which would otherwise be required for the capacitor plate electrode to contact an interconnection layer.

According to the present invention, there is also provided a method of manufacturing a semiconductor memory device having a static memory cell comprising a flip-flop composed of a pair of driver transistors having respective storage nodes, and a pair of high-resistance loads disposed on and connected to the storage nodes, respectively, a pair of access transistors connected to the storage nodes, and a capacitive element connected through a dielectric film between the storage nodes, the method comprising the steps of forming an interlayer insulating film around a region including a junction between a gate electrode of each of the driver transistors and a polycrystalline silicon layer of each of the high-resistance loads, introducing an impurity into the junction to reduce the resistance thereof, forming a dielectric film on the entire surface formed so far, thereafter forming a semiconductor film on the entire surface formed so far, and patterning the semiconductor film and the dielectric film to cover at least the junction. The step of introducing an impurity comprises the step of ion-implanting arsenide into the junction.

In the above manufacturing method, the impurity is introduced into the junction between the high-resistance load layer and the gate electrode through an opening in the interlayer insulating film to reduce the resistance of the junction. Thereafter, the semiconductor film is formed on the entire surface. Then, the semiconductor film and the dielectric film are simultaneously patterned, providing the capacitive element which comprises a capacitor plate electrode. Consequently, a large capacitance can be provided over the storage nodes in a small interconnection region through a simple process at a low cost.

The impurity introduced into the junction is an N-type impurity such as arsenide, and the dielectric film is an $Si_3N_4$ film. The characteristics of the semiconductor memory device are not made unstable when a failure mode is detected of the high-resistance load layer and a P-channel TFT device by a bias temperature (BT) stress method.

The above and other objects, features, and advantages of the present invention will become apparent from the following description of an illustrative embodiment thereof to be read in conjunction with the accompanying drawings, in which like reference numerals represent the same or similar objects.

BRIEF DESCRIPTION OF THE DRAWINGS

FIGS. 8A through 8C are fragmentary cross-sectional views showing the manner in which the static random access memory device according to the present invention is manufactured.

DETAILED DESCRIPTION OF THE PREFERRED EMBODIMENT

Figure 7:
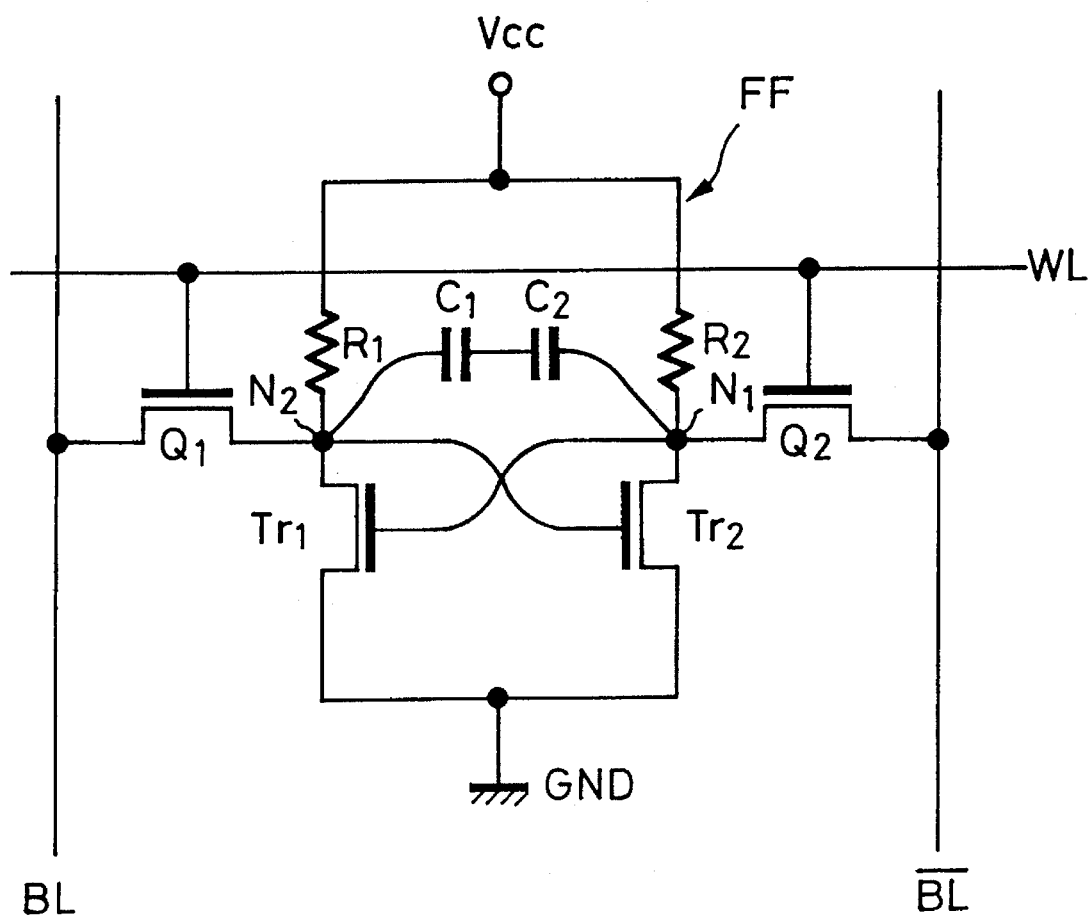
FIG. 7 is a circuit diagram of the memory cell shown in FIG. 3.

As shown in FIG. 7, a static random access memory device according to the present invention has a memory cell composed of a flip-flop FF comprising a pair of driver transistors $Tr_1$, $Tr_2$ such as N-channel MOS transistors and a pair of high-resistance loads $R_1$, $R_2$ connected respectively to storage nodes $N_1$, $N_2$ of the driver transistors $Tr_1$, $Tr_2$, and a pair of access transistors $Q_1$, $Q_2$ such as N-channel MOS transistors. To the memory cell, there are connected a word line WL and bit lines $\overline{BL}$.

The physical structure of the static random access memory device according to the present invention will be described below with reference to FIGS. 3 through 6.

Figure 4:
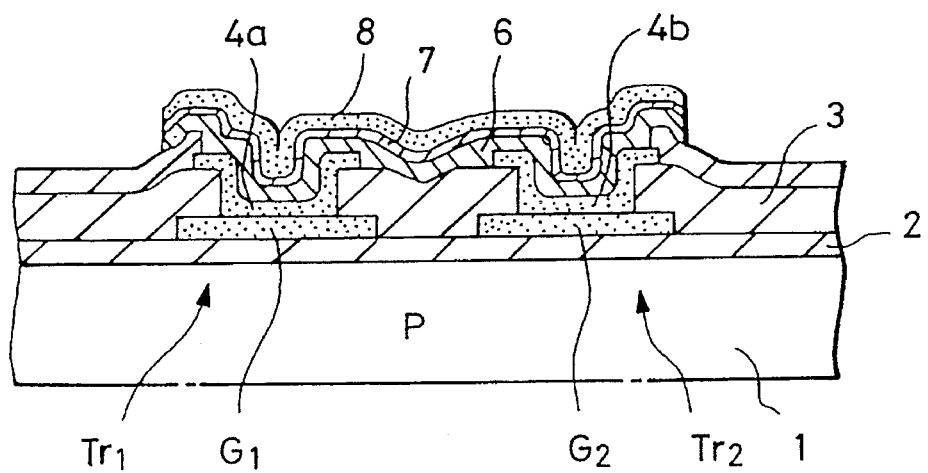
FIG. 4 is a cross-sectional view taken along line IV—IV of FIG. 3.
Figure 5:
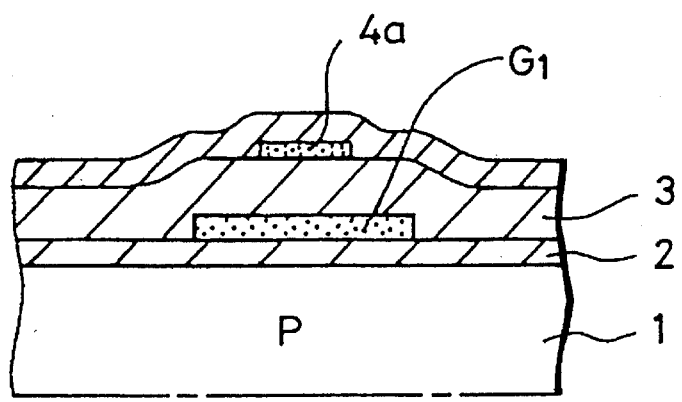
FIG. 5 is a cross-sectional view taken along line V—V of FIG. 3.
Figure 6:
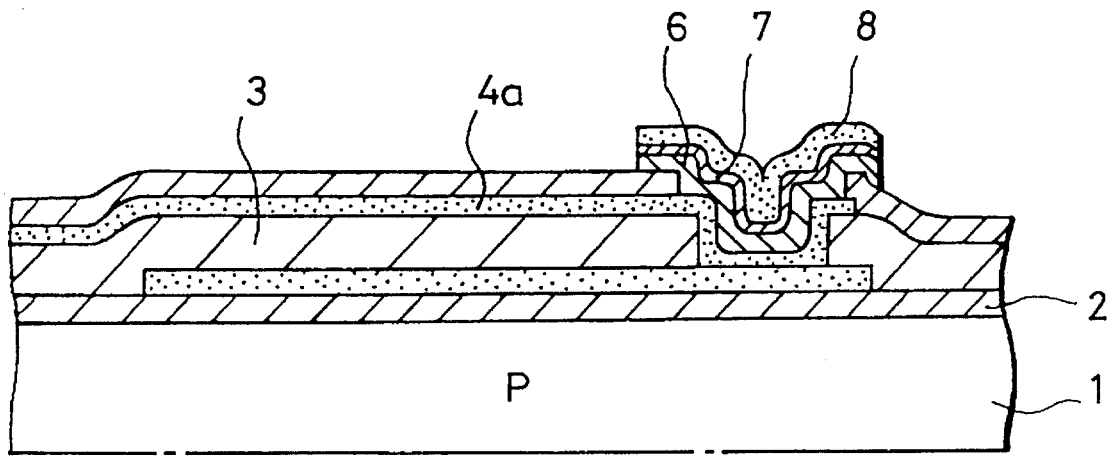
FIG. 6 is a cross-sectional view taken along line VI—VI of FIG. 3.

As shown in FIG. 4, the driver transistors $Tr_1$, $Tr_2$ have respective gate electrodes $G_1$, $G_2$ provided by a first layer of polycrystalline silicon that is disposed over a P-type well region 1 with a gate insulating film 2 of $SiO_2$ or the like interposed therebetween. Second layers 4a, 4b of polycrystalline silicone (also referred to as high-resistance load layers) which serve as the respective high-resistance loads $R_1$, $R_2$ are disposed over the respective gate electrodes $G_1$, $G_2$ with an interlayer insulating film 3 interposed therebetween (see also FIG. 5).

The gate electrodes $G_1$, $G_2$ have portions connected to drain regions (not shown) of the respective access transistors $Q_1$, $Q_2$.

Figure 3:
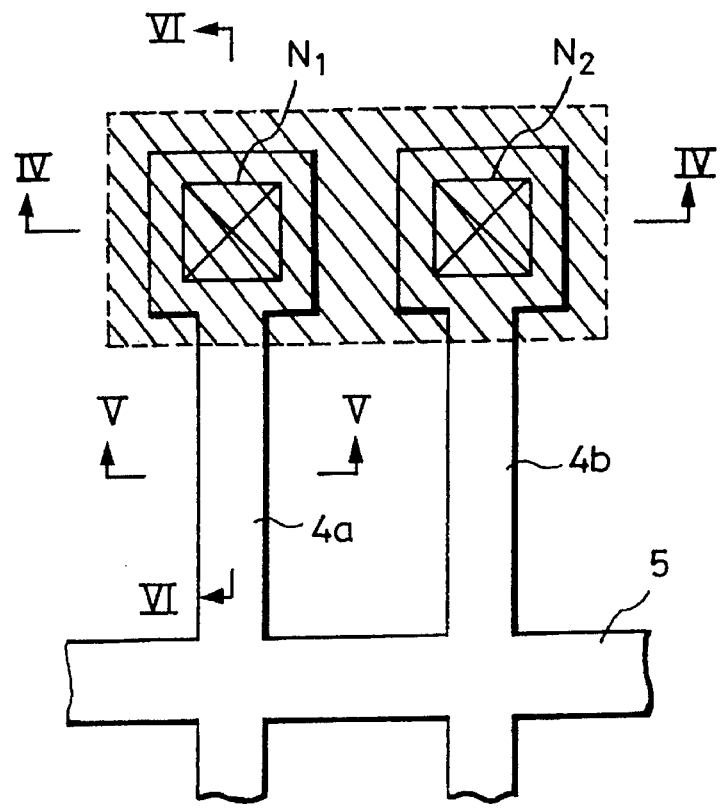
FIG. 3 is a fragmentary plan view of a memory cell of a static random access memory device according to the present invention.

As shown in FIG. 3, a Vcc line 5 is connected to the second layers or high-resistance load layers 4a, 4b. The high-resistance load layers 4a, 4b are connected to the lower gate electrodes $G_1$, $G_2$ in junctions or storage nodes $N_1$, $N_2$, respectively.

As shown in FIG. 4, a capacitor plate electrode 8 (shown hatched in FIG. 3) comprising a continuous layer of polycrystalline silicon is disposed over the storage nodes $N_1$, $N_2$ with a dielectric film 6 of $Si_3N_4$ and a thermal oxide film 7 thereof interposed therebetween. The capacitor plate electrode 8 provides two capacitors $C_1$, $C_2$ connected in series between the storage nodes $N_1$, $N_2$ as shown in FIG. 7.

The total capacitance provided by the two capacitors $C_1$, $C_2$ will be described below. If the capacitances of the two capacitors $C_1$, $C_2$ are equal to each other ($C_1=C_2=C$), then since the capacitor plate electrode 8 is not grounded, the total capacitance of the capacitors $C_1$, $C_2$ is C/2 as indicated by the following equation (1):

$$\frac{1}{\frac{1}{C_1}+\frac{1}{C_2}} = \frac{C}{2} \qquad (1)$$

Figure 1:
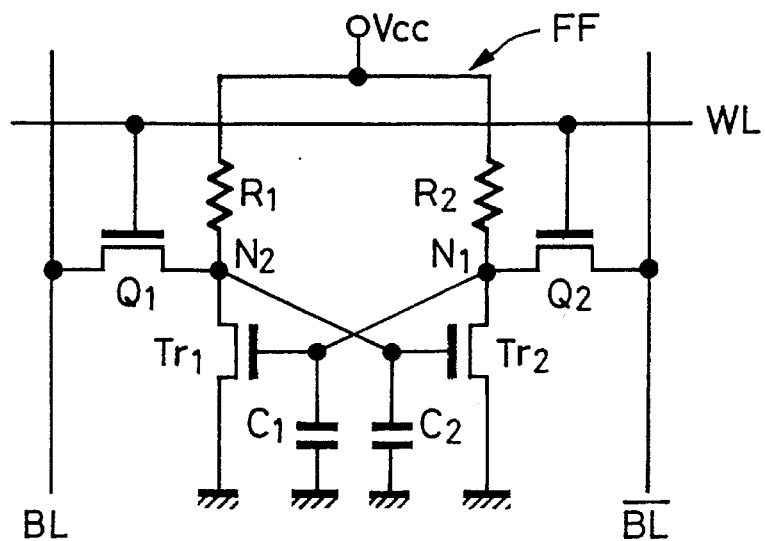
FIG. 1 is a circuit diagram of a memory cell of a conventional static random access memory device.
Figure 2:
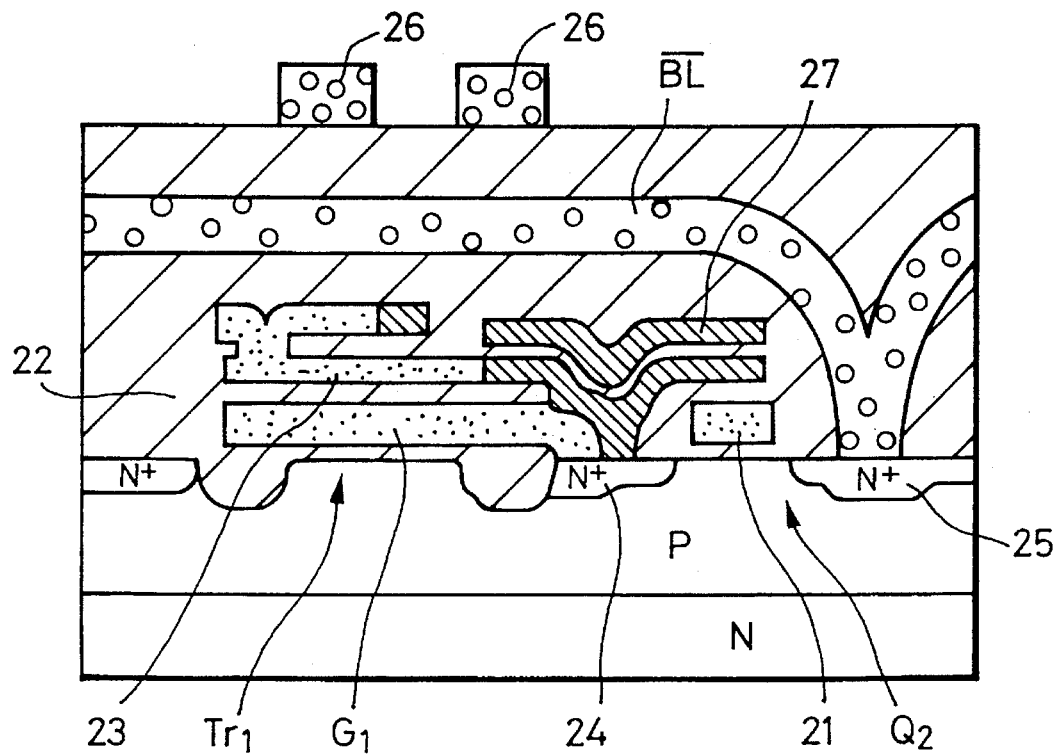
FIG. 2 is a cross-sectional view of the memory cell of the conventional static random access memory device.

In the conventional SRAM memory cell shown in FIGS. 1 and 2, the capacitor plate electrode 27 is grounded, and the capacitances C are provided respectively over the storage nodes $N_1$, $N_2$.

The capacitance by the capacitors $C_1$, $C_2$ shown in FIG. 7 appears as a mirror capacitance in view of the operation of the flip-flop FF in the SRAM. Therefore, as indicated by the following equation (2), the capacitors $C_1$, $C_2$ operate as giving a doubled capacitance, and hence the effective capacitance produced thereby is the same as the capacitance in the conventional SRAM configuration:

$$\frac{C}{2} \times 2 = C \qquad (2)$$

As described above, since the storage nodes $N_1$, $N_2$ of the driver transistors $Tr_1$, $Tr_2$ are interconnected by the capacitor plate electrode 8 through the dielectric film 6, i.e., equivalently by the two capacitors $C_1$, $C_2$ that are connected in series between the storage nodes $N_1$, $N_2$, the two capacitors $C_1$, $C_2$ provide a mirror capacitance because of the operation of the flip-flop, giving the same capacitance as the capacitance in the conventional SRAM configuration, even with the capacitor plate electrode 8 being not grounded.

Stated otherwise, a large capacitance is provided over the storage nodes $N_1$, $N_2$ without the capacitor plate electrode 8 being grounded. Accordingly, no interconnection region is required for grounding the capacitor plate electrode 8, and it is not necessary to form an interconnection layer which would otherwise be needed to ground the capacitor plate electrode 8 to a ground line, and to define an opening which would otherwise be required for the capacitor plate electrode 8 to contact an interconnection layer. Because of the large capacitance over the storage nodes $N_1$, $N_2$, the SRAM according to the present invention is highly resistance to a software error that would otherwise be caused by exposure to α rays, for example.

A process of manufacturing the SRAM according to the present invention will be described below with reference to FIGS. 8A through 8C.

As shown in FIG. 8A, a gate insulating film 2 is deposited on a P-type well region 1, and then a gate electrode $G_1$ of a driver transistor $Tr_1$ is deposited on the gate insulating film 2. Thereafter, a first interlayer insulating film 3 of $SiO_2$ is deposited on the entire surface formed so far to a thickness of about 200 Å by chemical vapor deposition. Then, an opening 3a is defined in the first interlayer insulating film 3 for subsequent connection to a high-resistance load layer. A thin layer of polycrystalline silicon is deposited on the entire surface formed so far, and then patterned into a high-resistance load layer 4a. The high-resistance load layer 4a is connected through the opening 3a to the gate electrode $G_1$.

Then, as shown in FIG. 8B, a second interlayer insulating film 9 of $SiO_2$ is deposited on the entire surface formed so far by chemical vapor deposition. Then, an opening 9a is defined in the second interlayer insulating film 9 over the junction between the high-resistance load layer 4a and the gate electrode $G_1$. To reduce the resistance of the junction between the high-resistance load layer 4a and the gate electrode $G_1$, an N-type impurity such for example as arsenide (As) is ion-implanted through the opening 9a into the junction between the high-resistance load layer 4a and the gate electrode $G_1$ at a rate of $3 \times 10^{15} cm^{-2}$ with the energy of 25 KeV. After the ion implantation, the entire assembly is annealed for activation to improve the crystalline property.

Thereafter, as shown in FIG. 8C, light etching is effected on the entire surface formed so far in order to remove a natural oxide film off the surface of the high-resistance load layer 4a which is exposed through the opening 9a. Then, an $Si_3N_4$ film 6 is deposited on the entire surface to a thickness ranging from 50 to 100 Å by chemical vapor deposition. The deposited $Si_3N_4$ film 6 is thermally oxidized to improve the quality thereof. At this time, a thin thermal oxide film 7 is formed on the $Si_3N_4$ film 6.

Then, a layer of polycrystalline silicon is deposited on the entire surface to a thickness of about 500 Å by chemical vapor deposition, and patterned into a capacitor plate electrode 8. When the deposited layer of polycrystalline silicon is patterned into the capacitor plate electrode 8, the thermal oxide film 7 and the $Si_3N_4$ film 6 are also patterned. Subsequently, an impurity such as arsenic (As) is ion-implanted into the capacitor plate electrode 8 to lower the resistance thereof, after which the entire assembly is annealed for activation. The SRAM according to the present invention is now fabricated. Thereafter, an interlayer insulating film is deposited, a contact opening is defined, and an aluminum interconnection layer is deposited for connection through the contact opening, in the manner known in the art.

According to the fabrication process described above, the impurity is introduced into the junction between the high-resistance load layer 4a and the gate electrode $G_1$ through the opening 9a to reduce the resistance of the junction. Thereafter, the $Si_3N_4$ film 6 is deposited on the entire surface including the opening 9a, and then the layer 8 of polycrystalline silicon is deposited over the entire surface. The layer 8 of polycrystalline silicon, the thermal oxide film 7, and the $Si_{3N4}$ film 6 are thereafter simultaneously patterned, providing the capacitor plate electrode 8. Consequently, a large capacitance can be provided over the storage nodes $N_1$, $N_2$ in a small interconnection region through a simple process at a low cost.

The thermal oxide film 7 and the $Si_3N_4$ film 6 below the capacitor plate electrode 8 are limited to the region in the high-resistance load layer 4a where the N-type impurity has been introduced. As a consequence, the characteristics of the SRAM are not made unstable by the introduction of electric charges into the oxide-$Si_3N_4$ interface when a failure mode (crystal imperfection, oxide film defect, impurity contamination, or the like) is detected by a bias temperature (BT) stress method.

Having described a preferred embodiment of the invention with reference to the accompanying drawings, it is to be understood that the invention is not limited to that precise embodiment and that various changes and modifications could be effected by one skilled in the art without departing from the spirit or scope of the invention as defined in the appended claims.

What is claimed is:

1. A method of manufacturing a semiconductor memory device having a static memory cell comprising a flip-flop composed of a pair of driver transistors having respective storage nodes, and a pair of resistance loads disposed on and connected to said storage nodes, respectively, a pair of access transistors connected to said storage nodes, and a non-grounded capacitive element connected through a dielectric film between said storage nodes, said method comprising the steps of:

forming and interlayer insulating film around a region including a junction between a gate electrode of each of said driver transistors and a polycrystalline silicon layer of each of said resistance loads;

introducing an impurity into said junction to reduce the resistance thereof;

forming a dielectric film on an entire surface formed so far;

thereafter forming a polycrystalline film on an entire surface formed so far, to form said nongrounded capacitive element;

patterning said polycrystalline film and said dielectric film to cover at least said junction.

2. A method according to claim 1, wherein said step of introducing an impurity comprises the step of ion-implanting arsenic into said junction.

3. A method of manufacturing a semiconductor memory device having a static memory cell comprising a flip-flop composed of a pair of driver transistors having respective storage nodes, and a pair of resistance loads disposed on and connected to said storage nodes, a nongrounded bias capacitive element connected through a dielectric film between said storage nodes, respectively, a pair of access transistor connected to said storage nodes, the capacitance of said capactive element being increased by a mirror effect of said pair of access transistors, said method comprising the steps of:

forming an interlayer insulating film around a region including a junction between a gate electrode of each of said driver transistors and a polycrystalline silicon layer of each of said resistance loads;

introducing an impurity into said junction to reduce the resistance thereof;

forming a dielectric film on an entire surface formed so far;

thereafter forming a polycrystalline film on an entire surface formed so far, to form said nongrounded capacitive element; and patterning said polycrystalline film and said dielectric film to cover at least said junction.

4. The method of claim 3 including the step of patterning said capacitive element to isolate it from electrical contact except at said nodes.

* * * * *